US010276663B2

(12) United States Patent
Chen et al.

(10) Patent No.: US 10,276,663 B2
(45) Date of Patent: Apr. 30, 2019

(54) TUNNELING TRANSISTOR AND METHOD OF FABRICATING THE SAME

(71) Applicant: UNITED MICROELECTRONICS CORP., Hsin-Chu (TW)

(72) Inventors: Cheng-Guo Chen, Changhua County (TW); Kun-Yuan Wu, Kaohsiung (JP); Tai-You Chen, Changhua County (TW); Chiu-Sheng Ho, Taichung (TW); Po-Kang Yang, Taoyuan (TW); Ta-Kang Lo, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 156 days.

(21) Appl. No.: 15/213,370

(22) Filed: Jul. 18, 2016

(65) Prior Publication Data
US 2018/0019341 A1   Jan. 18, 2018

(51) Int. Cl.
| | | |
|---|---|---|
| H01L 29/66 | (2006.01) | |
| H01L 29/08 | (2006.01) | |
| H01L 29/78 | (2006.01) | |
| H01L 29/165 | (2006.01) | |
| H01L 29/739 | (2006.01) | |
| H01L 29/267 | (2006.01) | |

(52) U.S. Cl.
CPC ........ H01L 29/0847 (2013.01); H01L 29/165 (2013.01); H01L 29/66636 (2013.01); H01L 29/7391 (2013.01); H01L 29/7848 (2013.01); *H01L 29/267* (2013.01); *H01L 29/785* (2013.01)

(58) Field of Classification Search
CPC ............. H01L 29/66795; H01L 29/785; H01L 29/66636; H01L 29/7848; H01L 29/7851

USPC .......................................................... 257/192
See application file for complete search history.

(56) References Cited

U.S. PATENT DOCUMENTS 6,353,251 B1    3/2002 Kimura
7,446,372 B2 * 11/2008 Forbes .................. G11C 11/405
                                                      257/296
7,465,976 B2 * 12/2008 Kavalieros .......... H01L 29/7391
                                                      257/196
(Continued)

OTHER PUBLICATIONS

Vijayvargiya et al., "Effect of Doping Profile on Tunneling Field Effect Transistor Performance", 2013 Spanish Conference on Electron Devices (CDE) (2013).*

(Continued)

*Primary Examiner* — Jay C Kim
(74) *Attorney, Agent, or Firm* — Winston Hsu

(57) ABSTRACT

A tunneling transistor and a method of fabricating the same, the tunneling transistor includes a fin shaped structure, a source structure and a drain structure, and a gate structure. The fin shaped structure is disposed in a substrate, and the source structure and the drain structure are disposed the fin shaped structure, wherein an entirety of the source structure and an entirety of the drain structure being of complementary conductivity types with respect to one another and having different materials. A channel region is disposed in the fin shaped structure between the source structure and the drain structure and the gate structure is disposed on the channel region. That is, a hetero tunneling junction is vertically formed between the channel region and the source structure, and between the channel region and the drain structure in the fin shaped structure.

7 Claims, 7 Drawing Sheets

(56) References Cited

U.S. PATENT DOCUMENTS

| | | | | |
|---|---|---|---|---|
| 7,485,524 | B2* | 2/2009 | Luo | H01L 29/66636 257/E21.431 |
| 7,553,717 | B2* | 6/2009 | Chakravarthi | H01L 21/3065 257/E21.429 |
| 7,791,064 | B2* | 9/2010 | Shimamune | H01L 21/02381 257/19 |
| 7,834,345 | B2* | 11/2010 | Bhuwalka | H01L 29/7391 257/28 |
| 8,178,400 | B2* | 5/2012 | Chang | H01L 29/66356 257/E21.027 |
| 8,318,568 | B2* | 11/2012 | Doris | H01L 21/26586 257/E21.4 |
| 8,368,127 | B2* | 2/2013 | Zhu | B82Y 10/00 257/288 |
| 8,441,000 | B2* | 5/2013 | Chen | H01L 29/165 257/30 |
| 8,471,329 | B2* | 6/2013 | Bhuwalka | H01L 29/7391 257/327 |
| 8,587,075 | B2* | 11/2013 | Bhuwalka | H01L 29/66356 257/402 |
| 8,828,812 | B2* | 9/2014 | Bian | H01L 29/66356 257/E21.387 |
| 8,933,435 | B2* | 1/2015 | Goh | H01L 29/66545 257/39 |
| 8,993,415 | B2* | 3/2015 | Miyano | H01L 21/26506 257/E21.316 |
| 9,040,960 | B2* | 5/2015 | Chen | H01L 29/165 257/288 |
| 9,252,269 | B2* | 2/2016 | Anghel | H01L 29/7833 |
| 9,362,383 | B1* | 6/2016 | Balakrishnan | H01L 29/6653 |
| 9,425,297 | B2* | 8/2016 | Cho | H01L 29/66977 |
| 9,508,597 | B1* | 11/2016 | Liu | H01L 21/82343 |
| 9,613,955 | B1* | 4/2017 | Anderson | H01L 27/0886 |
| 9,673,757 | B2* | 6/2017 | Liu | H01L 29/66977 |
| 9,728,639 | B2* | 8/2017 | Xu | H01L 29/7848 |
| 10,096,709 | B2* | 10/2018 | Le | H01L 29/7391 |
| 2012/0326239 | A1 | 12/2012 | Sasaki et al. | |
| 2013/0285138 | A1* | 10/2013 | Vega | H01L 29/7391 257/330 |
| 2014/0273366 | A1* | 9/2014 | Lin | H01L 27/092 438/200 |
| 2015/0318214 | A1* | 11/2015 | Tsai | H01L 21/823487 257/9 |
| 2015/0340489 | A1* | 11/2015 | Xiao | H01L 29/785 257/105 |
| 2016/0056278 | A1* | 2/2016 | Avci | H01L 29/7391 257/12 |
| 2016/0308019 | A1* | 10/2016 | Migita | H01L 29/78 |
| 2016/0322460 | A1* | 11/2016 | Chung | H01L 29/165 |
| 2017/0236755 | A1* | 8/2017 | Basker | H01L 21/823431 257/192 |
| 2018/0261696 | A1* | 9/2018 | Glass | H01L 29/165 |
| 2018/0350932 | A1* | 12/2018 | Liu | H01L 29/4991 |
| 2018/0374927 | A1* | 12/2018 | Liu | H01L 21/28088 |

OTHER PUBLICATIONS

Vijayvargiya et al., "Effect of Drain Doping Profile on Double-Gate Tunnel Field-Effect Transistor and its Influence on Device RF Performance", IEEE Transactions on Nanotechnology 13 (2014), pp. 974-981.*

Vinh et al., "Effects of Source Doping Profile on Device Characteristics of Lateral and Vertical Tunnel Field-Effect Transistors", Tap chi Khoa hoc va Cong nghe 53 (2015) pp. 85-95.*

Jeon, "Band-to-Band Tunnel Transistor Design and Modeling for Low Power Applications", PhD Dissertation at University of California, Berkelely (2012).*

Olesinski et al., "The P—Si (Phosphorus-Silicon) System", Bulletin of Alloy Phase Diagrams 6 (1985) pp. 130-133.*

Beck et al., "Crystallography of SiP and SiAs Single Crystals and SiP Precipitates in Si", Journal of Applied Physics 37 (1966) pp. 4683-4687.*

Lee et al., Low-Power circuit analysis and design based on heterojunction tunneling transistors, Sep. 2013.

* cited by examiner

TUNNELING TRANSISTOR AND METHOD OF FABRICATING THE SAME

BACKGROUND OF THE INVENTION

1. Field of the Invention

The invention relates to a semiconductor device and method of fabricating the same, and more particularly, to a semiconductor device with a tunneling transistor and a method of forming the same.

2. Description of the Prior Art

Complementary metal-oxide-semiconductor (CMOS) field effect transistor is one of the core elements of the integrated circuits (ICs). As dimensions and operation voltages of CMOS device are continuously reduced or scaled down, higher performance and packaging density of the ICs are achieved. However, it is found that the power consumptions of CMOS device keeps increasing because the off-state leakage currents are increasing and a fact that the subthreshold slop (S.S) is limited to minimally about 60 mV/decade. Therefore, there has been developed the tunneling field effect transistor (TFET) device as a countermeasure against to the abovementioned problem.

Nevertheless, though the TFET device efficaciously solves the off-state leakage currents problem, it cannot be scaled down as expected due to the short channel effect (SCE), also it has smaller driving current therefore it is difficult for low-power application. Thus, it is still in need to develop an approach that is able to solve the aforementioned smaller driving current issues and to keep scaling down the device.

SUMMARY OF THE INVENTION

It is therefore an objective of the present invention to provide a tunneling transistor and a method of fabricating the same, in which a heterojunction tunneling transistor and a tri-gate structure are both applied to gain improved channel length and higher driving current improvement. Thus, the tunneling transistor in the present invention enables to show better subthreshold swing.

To achieve the purpose described above, the present invention further provides a tunneling transistor including a fin shaped structure, a source structure and a drain structure, a channel region, and a gate structure. The fin shaped structure is disposed in a substrate, and the source structure and the drain structure are disposed the fin shaped structure, wherein an entirety of the source structure and an entirety of the drain structure being of complementary conductivity types with respect to one another and having different materials. The channel region is disposed in the fin shaped structure between the source structure and the drain structure, and the gate structure is disposed on the channel region. That is, the hetero tunneling junction is vertically disposed between the channel region and the source structure, and between the channel region and the drain structure in the fin shaped structure.

To achieve the purpose described above, the present invention further provides a method of forming tunneling transistor including the following steps. First of all, a fin shaped structure is formed in a substrate, and a gate structure is formed across the fin shaped structure. Then, two recesses are formed at two sides of the gate structure in the fin shaped structure, wherein each of the recesses comprises a sidewall having an edge inclined toward the gate structure. Next, a source structure and a drain structure are formed in the recesses respectively, with an entirety of the source structure and an entirety of the drain structure being of complementary conductivity types with respect to one another and having different materials.

Overall, the present invention provides a TFET device having a tri-gate structure and a hetero tunneling junction between a channel region and a source structure and between the channel region and the drain structure. In this manner, the band gaps between the channel region and the source structure and between the channel region and the drain structure are sufficiently decreased due to the materials differences between the source structure, the channel region (intrinsic silicon) and the drain structure, thus electrons tunnel through from the valence band of the P-type source structure to the conduction band of the N-type drain structure. Also, since the TFET device of the present invention has the tri-gate structure, therefore the SCE and DIBL leakage may be successfully suppressed, and the driving current thereof is dramatically increased.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating a fabricating method of a tunneling transistor according to a first embodiment of the present invention; in which:

FIG. 1 shows a semiconductor structure at the beginning of the fabricating process;

FIG. 2 shows a cross-sectional view taken along line A-A' in FIG. 1;

FIG. 3 shows a cross-sectional view of a semiconductor structure after forming a recess;

FIG. 4 shows a cross-sectional view of a semiconductor structure after forming a source structure;

FIG. 5 shows a cross-sectional view of a semiconductor structure after forming another recess;

FIG. 6 shows a cross-sectional view of a semiconductor structure after forming a drain structure; and FIG. 7 shows a three-dimensional view of the semiconductor structure in FIG. 6.

FIG. 8 to FIG. 9 are schematic diagrams illustrating a fabricating method of a tunneling transistor according to a second embodiment of the present invention; in which:

FIG. 8 shows a cross-sectional view of a semiconductor structure after forming a doped region;

FIG. 9 shows a cross-sectional view of a semiconductor structure after forming a source structure and a drain structure.

DETAILED DESCRIPTION

To provide a better understanding of the present invention, preferred embodiments will be described in detail. The preferred embodiments of the present invention are illustrated in the accompanying drawings with numbered elements.

Figure 1:
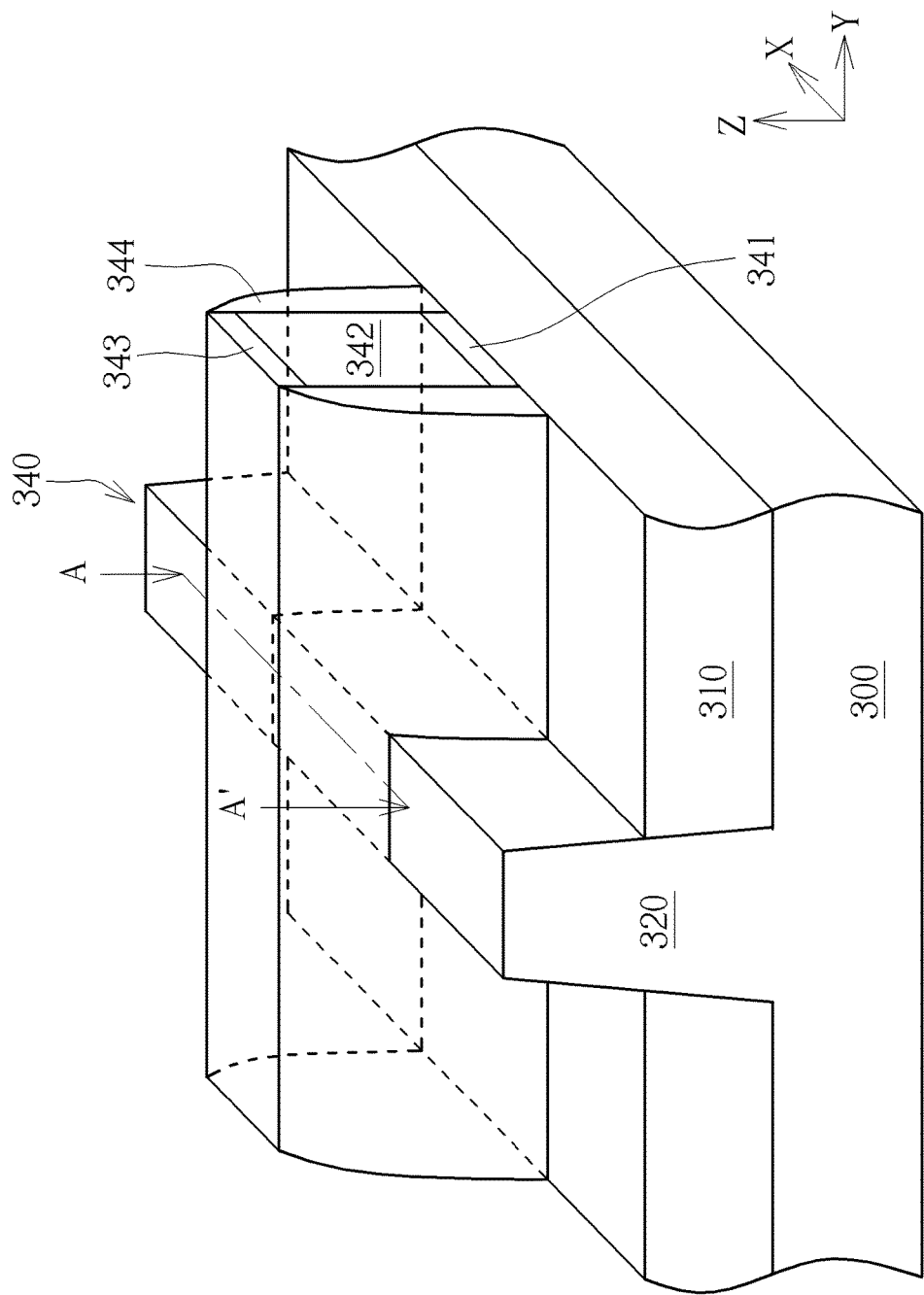
Figure 2:
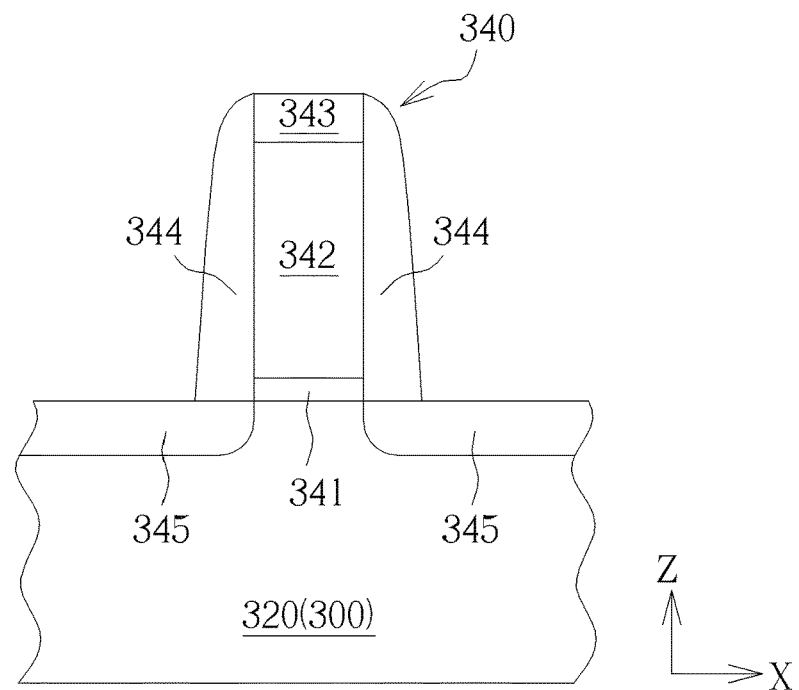

Referring to FIGS. 1-7, FIGS. 1-7 illustrate a fabricating method of a tunneling transistor according to the first preferred embodiment of the present invention. As shown in FIGS. 1-2, a substrate 300 for example a bulk silicon substrate, an epitaxial silicon substrate or a silicon-on-insulator (SOI) substrate is firstly provided. Then, at least one fin shaped structure 320 is formed in the substrate 300 and at least one gate structure 340 is formed across the fin shaped structure 320. It should be noted that the quantity of the fin shaped structure 320 and the gate structure 340 is not limited to what is shown in FIG. 2 and more fin shaped structure 320 and more gate structure 340 may be formed depended on the practical requirements.

For example, the formation of the fin shaped structure 320 is accomplished through a spacer self-aligned double-patterning (SADP) for example including forming a patterned mask (not shown in the drawings) on the substrate 300, transferring patterns of the patterned mask to the substrate 300 through an etching process to form a plurality of trenches (not shown in the drawings) in the substrate 300, and removing the patterned mask. Next, an insulating layer 310 is filled in the trenches. That is, a portion of the substrate 300 protruded from the insulating layer 310 forms the fin shaped structure 320 and the insulating layer 310 itself forms a shallow trench isolation (STI) for providing electrical isolation.

In the present embodiment, one gate structure 340 is formed perpendicular to the fin shaped structure 320. The gate structure 340 includes a gate dielectric layer 341, a gate electrode 342, a capping layer 343 and a spacer 344. The gate structure 340 covers a portion of the fin structure 320, that is, the gate dielectric layer 341 and the gate electrode 342 also cover a portion of sidewalls of the fin structure 320. The gate dielectric layer 341 includes silicon dioxide ($SiO_2$) or silicon nitride (SiN). In a preferred embodiment, the gate dielectric layer 341 may further include a high-k dielectric material such as hafnium oxide (HfO), hafnium silicate (HfSiO), or metal oxide or metal silicate exemplarily of aluminum (Al), zirconium (Zr), lanthanum (La). The gate electrode 342 includes polysilicon like undoped polysilicon, doped polysilicon or amorphous silicon. The capping layer 343 may include SiN, silicon carbide (SiC), or silicon carbonitride (SiCN). Additionally, the spacer 344 includes high temperature oxide (HTO), SiN, $SiO_2$, silicon oxynitride (SiON) or SiN formed by hexachlorodisilane ($Si_2Cl_6$) (HCD-SiN).

In one embodiment, the forming process of the gate structure 340 includes following steps. Firstly, a gate dielectric material layer (not shown in the drawings), a gate material layer (not shown in the drawings) and a capping material layer (not shown in the drawings) are stacked one over another on the substrate 300, and the stacked layers are patterned to form a gate stack structure (not shown in the drawings). However, in another embodiment, the formation of the gate stack structure may also be accomplished through a SADP process. Subsequently, two light doped drain (LDD) regions 345 are formed in the fin shaped structure 320 at two sides of the gate stack structure, and the spacer 344 is formed to cover sidewalls of the gate stack structure. It is understood that the formation of the gate structure 340 is not limited thereto and may include other steps depending to the gate-first or gate-last process, and a work function metal layer and a metal gate electrode may also be formed.

Figure 3:
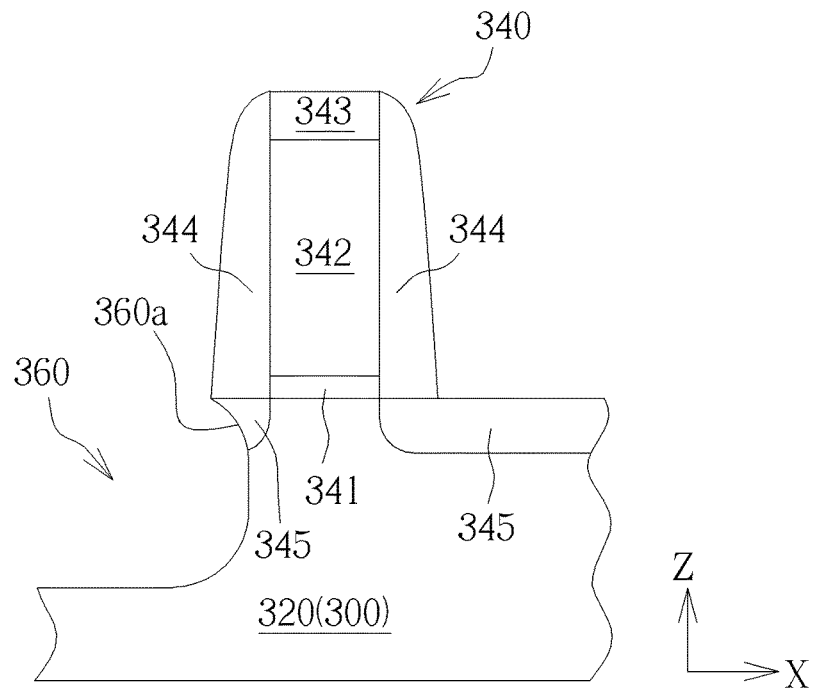

As shown in FIG. 3, a first recess 360 with a round bottom is formed at one side of the gate structure 340 in the fin shaped structure 320. The first recess 360 has an under-recessed portion under the spacer 344, in which an edge 360a thereof is inclined toward the gate structure 340 as shown in FIG. 3. It is noted that the edge 360a is right under the spacer 344 in a projection direction (such as the direction z) instead of extending over the area of the spacer 344, and the edge 360a is not limited to include an angle of about 15-45 degrees to the top surface of the fin shaped structure 320. Moreover, in one embodiment of further forming two dummy gate structures (not shown in the drawings) covered on two edges of the fin shaped structure 320, the first recess may be formed to include a symmetric shape (not shown in the drawings). That is, two opposite sidewalls of the first recess 360 both include the inclined edges being inclined toward the gate structure and the dummy gate structure respectively. However, it is also understood that, the first recess in the embodiment of having the dummy gate structures may also be formed to include an asymmetric shape. That is, another sidewall opposite to the sidewall with edge 360a is vertically aligned with a spacer of the dummy gate structure (not shown in the drawings).

The first recess 360 is formed through a sequent perform of at least one laterally etching and at least one vertically etching. For example, after forming a hard mask layer (not shown in the drawings) such as a SiN layer to cover the fin shaped structure 320 at another side of the gate structure 340, a first etching process such as a dry etching process is firstly performed by using the gate structure 340 and the spacer 344 as a mask, to form a primary recess (not shown in the drawings), and a second etching process and a third etching process such as dry etching processes are next performed in turn to further etching the primary recess formed in the first etching process, particular to sidewalls thereof. Precisely speaking, the first etching process is conducted to vertically etch the fin shaped structure 320 along the spacer 344, so as to form the primary recess at one side of the gate structure 340 in the fin shaped structure 320, such that, the sidewall of the primary recess is vertically aligned with the spacer 344. Then, the second etching process is conducted to laterally etch the sidewall of the primary recess to further expand the top portion of the sidewall under the spacer 344 to form an inclined sidewall with the inclined edge 360a. According to a preferred embodiment, the second etching process may be accomplished by adjusting the bias power of the processing equipment, such as slightly lowering the bias power to expand the primary recess by lateral etching thereto ensures the first recess 360 formed subsequently will not be turned into diamond shaped or hexagonal (or sigma) shaped recess produced by conventional wet etching process. Finally, the third etching process is conducted to further etch the primary recess for increasing the depth therefore a bottom portion of the recess 360 reveals a slightly circular profile as shown in FIG. 3.

Figure 4:
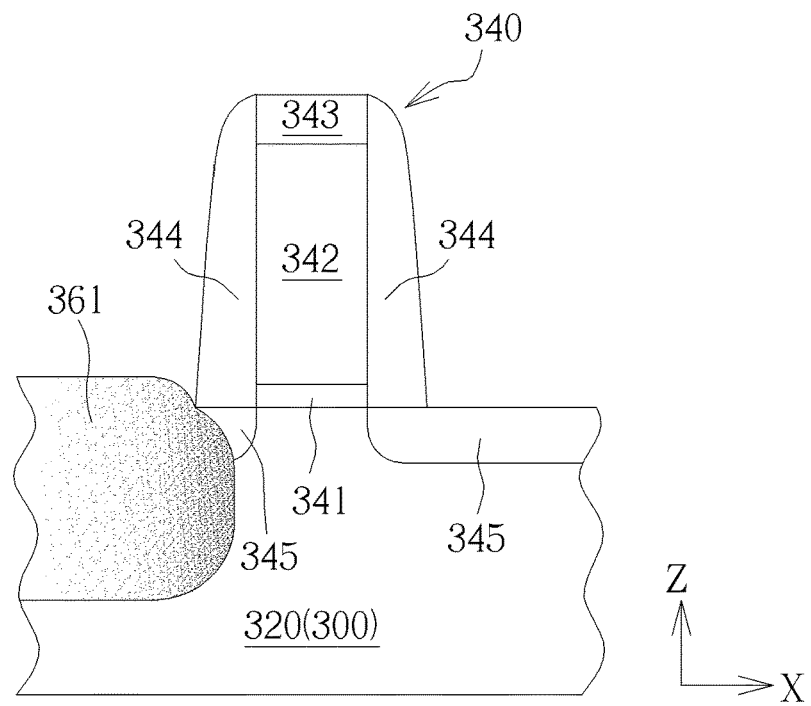

Afterwards, a pre-clean process is selectively performed by using a cleaning agent like diluted hydrofluoric acid or SPM containing sulfuric acid, hydrogen peroxide, and deionized water to remove native oxide or other impurities from the surface of the recess 360. Then, a source structure 361 is then formed in the recess 360 to fill up the recess 360, as shown in FIG. 4.

In the present embodiment, the source structure 361 includes group V epitaxial compound such as silicon germanium (SiGe), silicon germanium boron (SiGeB) or silicon germanium stannum (SiGeSn) or group III epitaxial compound such as silicon carbide (SiC), SiP or SiCP, but not limited thereto. In one embodiment, the source structure 361 includes a buffer layer (not shown in the drawings) and an epitaxial layer (not shown in the drawings) disposed on the buffer layer, in which the buffer layer is conformally grown on surfaces of the recess 360, and the epitaxial layer is formed on the buffer layer through a selectively epitaxial growth (SEG) process. Moreover, while the epitaxial structure is formed, an in situ doping process is simultaneously performed to dope heterogeneous atoms such as boron (B) into the epitaxial structure therefore the source structure 361 is formed.

In the present embodiment, the buffer layer and the epitaxial layer preferably include the same material, such as SiGe, in which the Ge concentration (such as being about greater than 60%) in the buffer layer is greater than the Ge concentration in the epitaxial layer. Also, In one embodiment, the epitaxial layer may be formed by the SEG process through a single or a multiple layer approach, and the heterogeneous atoms such as Ge atoms may also be altered in a gradual arrangement away from the direction x, to facilitate the subsequent processes, but is not limited thereto.

Figure 5:
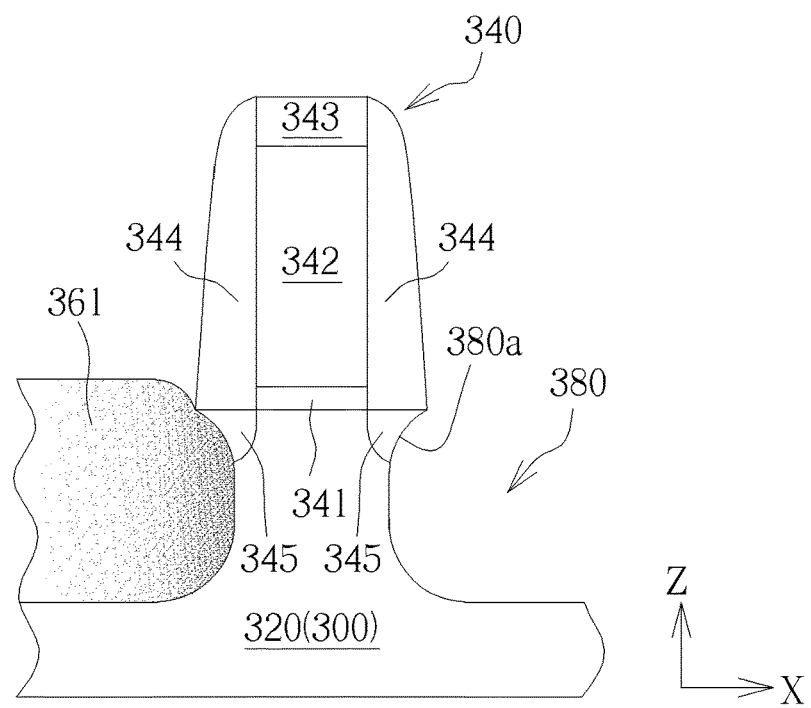

Following these, the hard mask layer is removed and a second recess 380 is formed at another side of the gate structure 340 in the fin shaped structure 320. The second recess 380 also includes a round bottom and an under-recessed portion under the spacer 344, in which an edge 380a thereof is inclined toward the gate structure 340 as shown in FIG. 5. It is noted that the edge 380a is right under the spacer 344 in a projection direction (such as the direction z) instead of extending over the area of the spacer 344, and the edge 380a is not limited to include an angle of about 15-45 degrees to the top surface of the fin shaped structure 320. In one embodiment, the second recess may also be formed to include a symmetric shape. That is, two opposite sidewalls of the first recess 380 both include the edges inclined toward the gate structure and the dummy gate structure (not shown in the drawings) respectively. However, it is also understood that, the second recess in another embodiment may also be formed to include an asymmetric shape, for example another sidewall opposite to the sidewall with edge 380a is perpendicular to the top surface of the substrate 300 and vertically aligned with a spacer of the dummy gate structure (not shown in the drawings).

Figure 6:
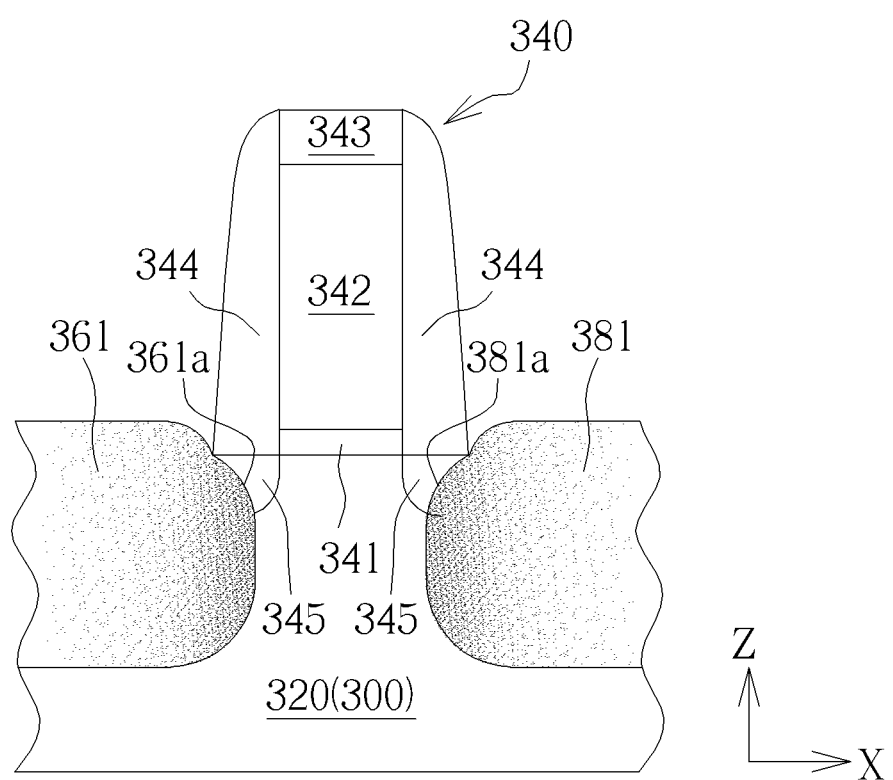

The formation of the second recess 380 is substantially the same as those of forming the first recess 360 shown in FIG. 3, such as including performing a first etching process, a second etching process and a third process after forming a hard mask layer (not shown in the drawings) such as a SiN layer to cover the source structure 361, and the detailed process thereof will not be redundantly described herein. After that, a pre-clean process is selectively performed by using a cleaning agent like diluted hydrofluoric acid or SPM containing sulfuric acid, hydrogen peroxide, and deionized water to remove native oxide or other impurities from the surface of the recess 380. Then, a drain structure 381 is then formed in the recess 380 to fill up the recess 380, as shown in FIG. 6.

In the present embodiment, the drain structure 381 includes group III or group V epitaxial compound which is differ from the material of the source structure 361. For example, if the source structure 361 includes group V epitaxial compound, such as SiGe, and the drain structure 381 includes group III epitaxial compound, such as SiC or SiP. In one embodiment, the drain structure 381 also includes a buffer layer (not shown in the drawings) and an epitaxial layer (not shown in the drawings) disposed on the buffer layer, in which the buffer layer is conformally grown on surfaces of the recess 380, and the epitaxial layer is formed on the buffer layer through a SEG process. Moreover, while the epitaxial structure is formed, an in situ doping process is simultaneously performed to dope heterogeneous atoms such as P or C into the epitaxial structure therefore the drain structure 381 is formed.

In the present embodiment, the buffer layer and the epitaxial layer preferably include the same material, such as SiP, in which the P concentration (such as being about greater than 60%) in the buffer layer is greater than the P concentration in the epitaxial layer. In another embodiment, the epitaxial layer may be formed by the SEG process through a single or a multiple layer approach, and the heterogeneous atoms such as P atoms may also be altered in a gradual arrangement along the direction x, to facilitate the subsequent processes, but is not limited thereto.

Through the aforementioned steps, the TFET device according to the first preferred embodiment of the present invention is provided. In the subsequent process, a replacement metal gate process may be performed then to replace the gate electrode 342 with a metal gate, a silicidation process is performed to form a silicide layer on at least the partial surface of the source structure 361/drain structure 381; and/or a contact plug process to form contact plug which is electrically connected to the source structure 361, drain structure 381 and/or the metal gate.

The TFET device of the present invention includes the gate structure 340 across the fin shaped structure 340, and the source structure 361 and the drain structure 381 disposed at two sides of the gate structure 340, and the fin shape structure 320 covered by the gate structure 340 between the source structure 361 and the drain structure 381 forms the channel region. It is noted that the source structure 361 and the drain structure 381 are complementary conductivity types with respect to one another, in which the source structure 361 includes SiGe, SiGeB or SiGeSn with P-type doping and the drain structure 381 includes SiP, SiC or SiCP with N-type doping. That is, a hetero tunneling junction is formed vertically between the channel region and the source structure 361, and between the channel region and the drain structure 381 in the fin shaped structure 320.

Figure 7:
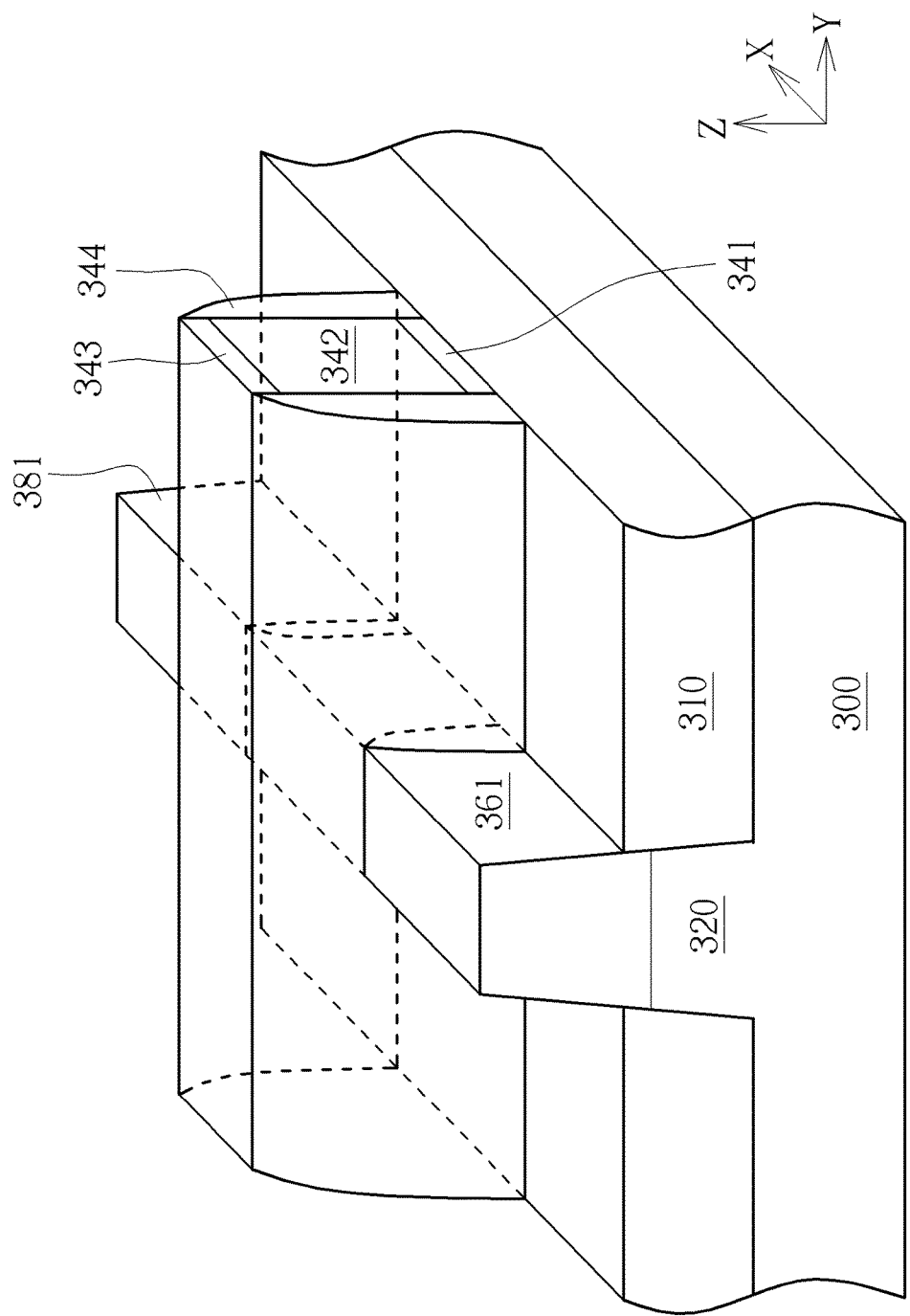

Please also noted that, the source structure 361 and the drain structure 381 also include the inclined edge 361a, 381a at the sidewall under the spacer 344, and the P-type, N-type and/or the heterogeneous atoms such as Ge, B, P or C atoms are gradual arrangement in the source structure 361 and the drain structure 381, for example being decreasing from the sidewalls with the inclined edge 361a, 381a to another sidewall opposite thereto. That is, the concentration heterogeneous atoms are gradually decreased from the sidewall near the channel region to the opposite sidewall away from the channel region thereto ensure the features and functions of the channel region in the TFET device. In this manner, the band gaps between the channel region and the source structure 361, and between the channel region and the drain structure 381 are sufficiently decreased due to the materials differences between the source structure 361, the channel region (intrinsic silicon) and the drain structure 381, thus electrons tunnel through from the valence band of the P-type source structure 361 to the conduction band of the N-type drain structure 381. Furthermore, since the TFET device is a tri-gate device as shown in FIG. 7, therefore the SCE and DIBL leakage may be successfully suppressed, and the driving current thereof is dramatically increased.

According to the fabricating method of the present embodiment, multi-stepped dry etching process is performed to form the under recessed recesses 360, 380 with the inclined edge 361a, 381a respectively, so that, the sidewalls with the edge 360a, 380a are formed right under the spacer 344 with the edge 360a, 380a being not extending over the spacer 344 in the projection direction. Through forming such under recessed recesses 360, 380, the source structure 361 and the drain structure 381 may be conformally and uniformly formed in the recesses 360, 380 without affecting the channel region therebetween. Thus, by using this approach, the TFET device can integrated with strained silicon and tri-gate technologies thereto to gain improved driving currents.

The following description will detail other different embodiments or variant embodiments of the fabricating method of the TFET device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
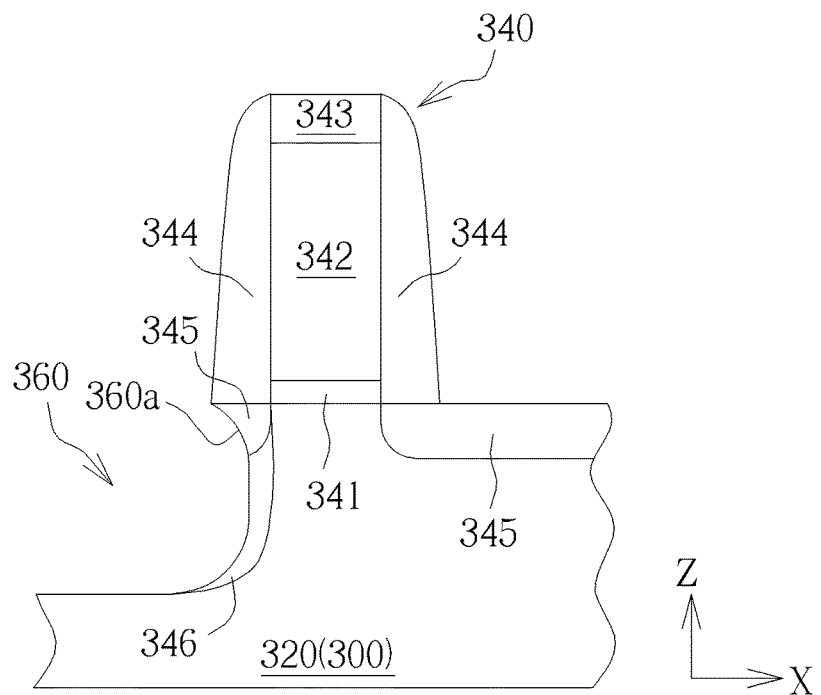
Figure 9:
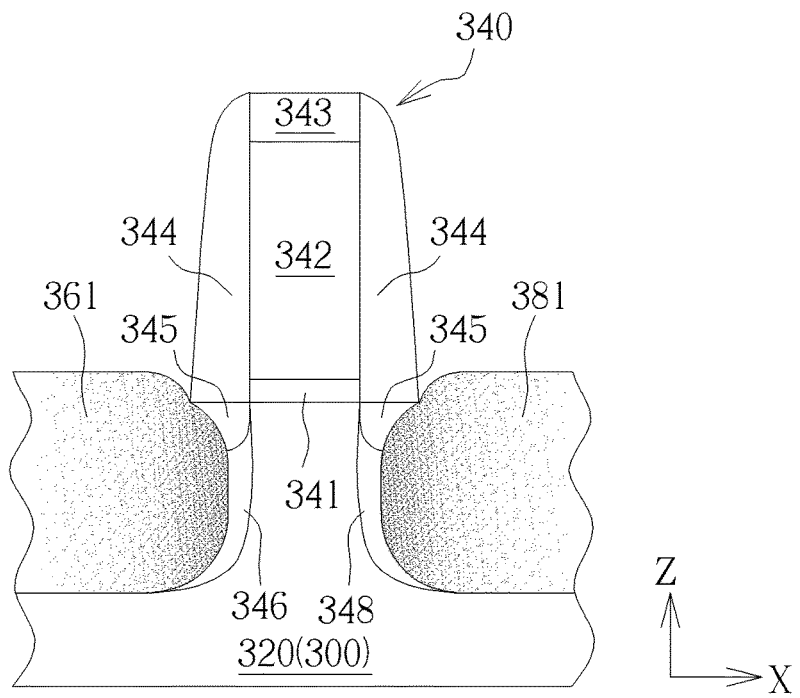

Please refer to FIGS. 8-9, which are schematic diagrams illustrating a fabricating method of a TFET device according to the second preferred embodiment of the present invention. The formal steps in the present embodiment are similar to those as in FIGS. 1-3 in the first preferred embodiment and will not be redundantly described herein. The differences between the present embodiment and the aforementioned first preferred embodiment are in that after forming the semiconductor structure shown in FIG. 3, an additionally ion-implantation process is performed on surfaces of the sidewall under the spacer 344 to forma first doped region 346 in the fin shaped structure 320 under the spacer 344, as shown in FIG. 8.

The first doped region 346 is formed before the source structure 361 is formed, and the first doped region 346 includes a P-type dopant such as boron (B), but is not limited thereto. In one embodiment, the first doped region 346 may further include high concentration (for example being greater than 60%) of Ge thereto facilitate the formation of the source structure 361 with gradually arranged Ge in a subsequent process. Then, another ion-implantation process is also performed after the second recess (not shown in the drawings of the present embodiment) is formed, to also form a second doped region 348 on surfaces of the sidewall of the second recess under the spacer 344 before the drain structure 381 is formed as shown in FIG. 9. Likewise, the second doped region 348 includes an N-type dopant such as P, but is not limited thereto. In one embodiment, the second doped region 348 may further include high concentration (for example being greater than 60%) of P thereto facilitate the formation of the drain structure 381 with gradually arranged P in a subsequent process.

Thus, through forming first and second doped regions 346, 348 adjacent to the sidewalls of the source structure 361 and the drain structure 381 under the spacer 344, the band gaps between the channel region and the source structure 363, and between the channel region and the drain structure 383 can be further decreased, therefore the SCE and DIBL leakage may be successfully suppressed, and the driving current will be further improved.

Figure 10:
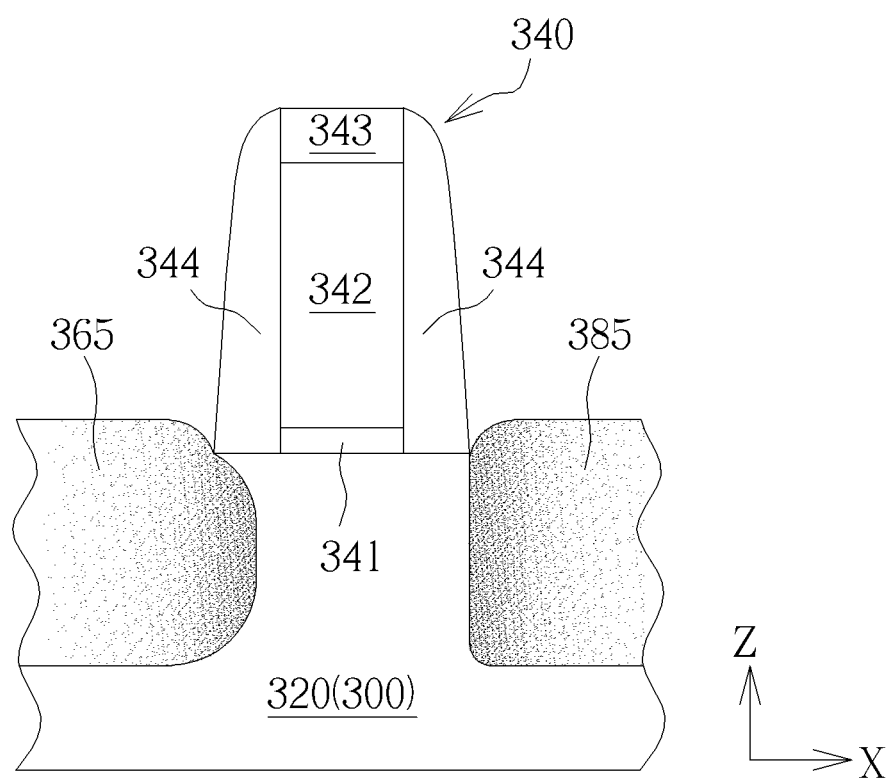
FIG. 10 is a schematic diagram illustrating a tunneling transistor according to a third embodiment of the present invention.

Please refer to FIG. 10, which is a schematic diagram illustrating a TFET device according to the third preferred embodiment of the present invention. The most structures of the present embodiment are substantially similar to those of the TFET device of the first embodiment shown in FIG. 6, and will not be redundantly described herein. The differences between the present embodiment and the aforementioned first embodiment are in that the source structure 365 and the drain structure 385 are asymmetric with one another, as shown in FIG. 10.

Precisely speaking, in the present embodiment, the formation of the source structures 365 is substantially similar to the forming processes of the source structure 361 of the first preferred embodiment. However, the drain structure 385 is formed through a one-stepped dry etching process to only vertically etch the fin shaped structure 320 along the spacer 344 to form a recess (not shown in the drawings) with a sidewall being vertical aligned with the spacer 344. Following these, the drain structure 385 is formed to fill up the recess. That is, the drain structure 385 may also include a sidewall vertical aligned with the spacer 344 as shown in FIG. 10.

In the present embodiment, the source structure 365 and the drain structure 385 not only include different materials, but also include asymmetric shapes. In this manner, the band gaps between the channel region and the source structure 365, and between the channel region and the drain structure 385 are further decreased due to the materials and shapes differences between the source structure 365, the channel region (intrinsic silicon) and the drain structure 385, thus the TFET device of the present embodiment can further improve the SCE and DIBL leakage and gain more improved driving currents.

In summary, the present invention provides a TFET device having a tri-gate structure and a hetero tunneling junction between a channel region and a source structure and between the channel region and the drain structure. In this manner, the band gaps between the channel region and the source structure and between the channel region and the drain structure are sufficiently decreased due to the materials differences between the source structure, the channel region (intrinsic silicon) and the drain structure, thus electrons tunnel through from the valence band of the P-type source structure to the conduction band of the N-type drain structure. Also, since the TFET device of the present invention has the tri-gate structure, therefore the SCE and DIBL leakage may be successfully suppressed, and the driving current thereof is dramatically increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A tunneling transistor comprising:
a fin shaped structure disposed in a substrate;
a source structure disposed in the fin shaped structure;
a drain structure disposed in the fin shaped structure, an entirety of the source structure and an entirety of the drain structure being of complementary conductivity types with respect to one another, wherein the source structure comprises SiGe with a concentration of Ge therein being gradually decreased along a direction away from a channel region, and the drain structure comprises SiP with a concentration of C being gradually decreased along a direction away from the channel region; or
alternatively wherein the drain structure comprises SiGe with a concentration of Ge therein being gradually decreased along the direction away from the channel region, and the source structure comprises SiP with a concentration of C being gradually decreased along a direction away from the channel region;
the channel region disposed in the fin shaped structure between the source structure and the drain structure, and a sidewall of the source structure and a sidewall of the drain structure being inclined toward the channel region;

a gate structure disposed on the channel region; and a hetero tunneling junction vertically disposed between the channel region and the source structure, and between the channel region and the drain structure in the fin shaped structure.

2. The tunneling transistor according to claim 1, wherein the source structure and the drain structure comprise an asymmetric shape.

3. The tunneling transistor according to claim 1, wherein the source structure and the drain structure are respectively disposed in two recesses and each of the recesses comprises a sidewall having an edge inclined toward the gate structure.

4. The tunneling transistor according to claim 3, further comprising a doped region disposed on surfaces of the sidewall.

5. The tunneling transistor according to claim 3, wherein the gate structure comprises a spacer and the sidewall of the source structure or the drain structure is disposed under the spacer in a projecting direction.

6. The tunneling transistor according to claim 1, wherein an opposite sidewall opposite to the sidewall of the source structure, or an opposite sidewall opposite to the sidewall of the drain structure also has an inclined edge vertical to the substrate.

7. The tunneling transistor according to claim 1, wherein an opposite sidewall opposite to the sidewall of the source structure, or an opposite sidewall opposite to the sidewall of the drain structure also has an inclined edge.

* * * * *

UNITED STATES PATENT AND TRADEMARK OFFICE
CERTIFICATE OF CORRECTION

PATENT NO. : 10,276,663 B2
APPLICATION NO. : 15/213370
DATED : April 30, 2019
INVENTOR(S) : Cheng-Guo Chen et al.

It is certified that error appears in the above-identified patent and that said Letters Patent is hereby corrected as shown below:

On the Title Page

Item (72), correct the citizenship of the second inventor from "Kaohsiung (JP)" to --Kaohsiung (TW)--.

Signed and Sealed this
Twenty-fifth Day of June, 2019

Andrei Iancu
*Director of the United States Patent and Trademark Office*